US012736709B2

(12) United States Patent
Mönch et al.

(10) Patent No.: US 12,736,709 B2
(45) Date of Patent: Sep. 15, 2026

(54) DEVICE FOR PRODUCING A LIGHT BARRIER

(71) Applicant: Robert Bosch GmbH, Stuttgart (DE)

(72) Inventors: Holger Joachim Mönch, Vaals (NL); Sven Bader, Neu-Ulm (DE); Jochen Hellmig, Valkenswaard (NL); Hans Spruit, Waalre (NL); Pieter Hoeven, Meierijstad (NL); Stephan Gronenborn, Aachen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 131 days.

(21) Appl. No.: 18/918,138

(22) Filed: Oct. 17, 2024

(65) Prior Publication Data

US 2025/0035812 A1 Jan. 30, 2025

Related U.S. Application Data

(63) Continuation of application No. PCT/EP2023/057081, filed on Mar. 20, 2023.

(30) Foreign Application Priority Data

Apr. 20, 2022 (DE) ..................... 10 2022 109 546.0

(51) Int. Cl.
*G01V 8/22* (2006.01)
*G01B 9/02* (2022.01)
(Continued)

(52) U.S. Cl.
CPC .............. *G01V 8/22* (2013.01); *H01S 5/0262* (2013.01); *H01S 5/18305* (2013.01);
(Continued)

(58) Field of Classification Search
CPC .......... G01V 8/22; G01V 8/14; H01S 5/0262; H01S 5/18305; H01S 5/0028;
(Continued)

(56) References Cited

U.S. PATENT DOCUMENTS 8,467,428 B2 6/2013 Gerlach et al.
2005/0116149 A1 6/2005 Lautenschlager et al.
(Continued)

FOREIGN PATENT DOCUMENTS

DE 10346813 A1 5/2005
DE 202006005978 U1 8/2007
(Continued)

OTHER PUBLICATIONS

Wikpedia "Photoelectric sensor", Jan. 11, 2020, pp. 1-3, found in internet under: https://web.archive.org/web/20200111223527/https://en.wikipedia.org/wiki/Photoelectric_sensor.

*Primary Examiner* — Monica T Taba
(74) *Attorney, Agent, or Firm* — NORTON ROSE FULBRIGHT US LLP

(57) ABSTRACT

A device for producing a light barrier includes a laser unit with at least one vertical cavity surface emitting laser (VCSEL), a photodiode, and a reflector. The reflector is configured to reflect light emitted by the VCSEL, such that a light reflection produced as a result is received by the photodiode, producing a detection signal, from which a direct current signal component is subtracted so that an alternating current component is provided as an evaluation signal. The evaluation signal has a higher signal-to-noise ratio than the detection signal, such that an evaluation device connected to the VCSEL is able to detect an interruption of the light reflection if no self-mixing interference is present.

15 Claims, 6 Drawing Sheets

(51) Int. Cl.

| | |
|---|---|
| ***G01S 17/04*** | (2020.01) |
| ***G01S 17/10*** | (2020.01) |
| ***G06F 3/042*** | (2006.01) |
| ***H01S 5/00*** | (2006.01) |
| ***H01S 5/026*** | (2006.01) |
| ***H01S 5/183*** | (2006.01) |
| ***H01S 5/42*** | (2006.01) |

(52) U.S. Cl.
CPC .......... *G01B 9/02092* (2013.01); *G01S 17/04* (2020.01); *G01S 17/10* (2013.01); *G06F 3/0421* (2013.01); *H01S 5/0028* (2013.01); *H01S 5/423* (2013.01)

(58) Field of Classification Search
CPC ..... H01S 5/423; G01B 9/02092; G01S 17/04; G01S 17/10; G06F 3/0421
See application file for complete search history.

(56) References Cited

U.S. PATENT DOCUMENTS

| | | | | |
|---|---|---|---|---|
| 2005/0157971 | A1 | 7/2005 | Juijve et al. | |
| 2005/0201716 | A1 | 9/2005 | Wuestefeld | |
| 2006/0152494 | A1 | 7/2006 | Liess | |
| 2020/0356159 | A1 * | 11/2020 | Mutlu | G06F 3/0423 |
| 2021/0003385 | A1 | 1/2021 | Tan et al. | |
| 2022/0099431 | A1 | 3/2022 | Chen et al. | |
| 2023/0350022 | A1 | 11/2023 | Halbritter | |

FOREIGN PATENT DOCUMENTS

| | | | |
|---|---|---|---|
| DE | 102020123559 | A1 | 3/2022 |
| EP | 1574880 | A1 | 9/2005 |
| WO | WO 2017218467 | A1 | 12/2017 |
| WO | 2021151860 | A1 | 8/2021 |

* cited by examiner 30
26
18
28
12 20
22
19
10

44
42
18
40
46
22
20
16
10
35

16
14
34
35

DEVICE FOR PRODUCING A LIGHT BARRIER

CROSS REFERENCE TO RELATED APPLICATIONS

This application is a continuation of International Application No. PCT/EP2023/057081 (WO 2023/202827 A1), filed on Mar. 20, 2023, and claims benefit to German Patent Application No. DE 10 2022 109 546.0, filed on Apr. 20, 2022. The aforementioned applications are hereby incorporated by reference herein.

FIELD

Embodiments of the present invention relate to a device for producing a light barrier.

OBJECT OF THE INVENTION

Embodiments of the present invention provide a device for producing a light barrier. The device includes a laser unit with at least one vertical cavity surface emitting laser (VCSEL), a photodiode, and a reflector. The reflector is configured to reflect light emitted by the VCSEL, such that a light reflection produced as a result is received by the photodiode, producing a detection signal, from which a direct current signal component is subtracted so that an alternating current component is provided as an evaluation signal. The evaluation signal has a higher signal-to-noise ratio than the detection signal, such that an evaluation device connected to the VCSEL is able to detect an interruption of the light reflection if no self-mixing interference is present.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
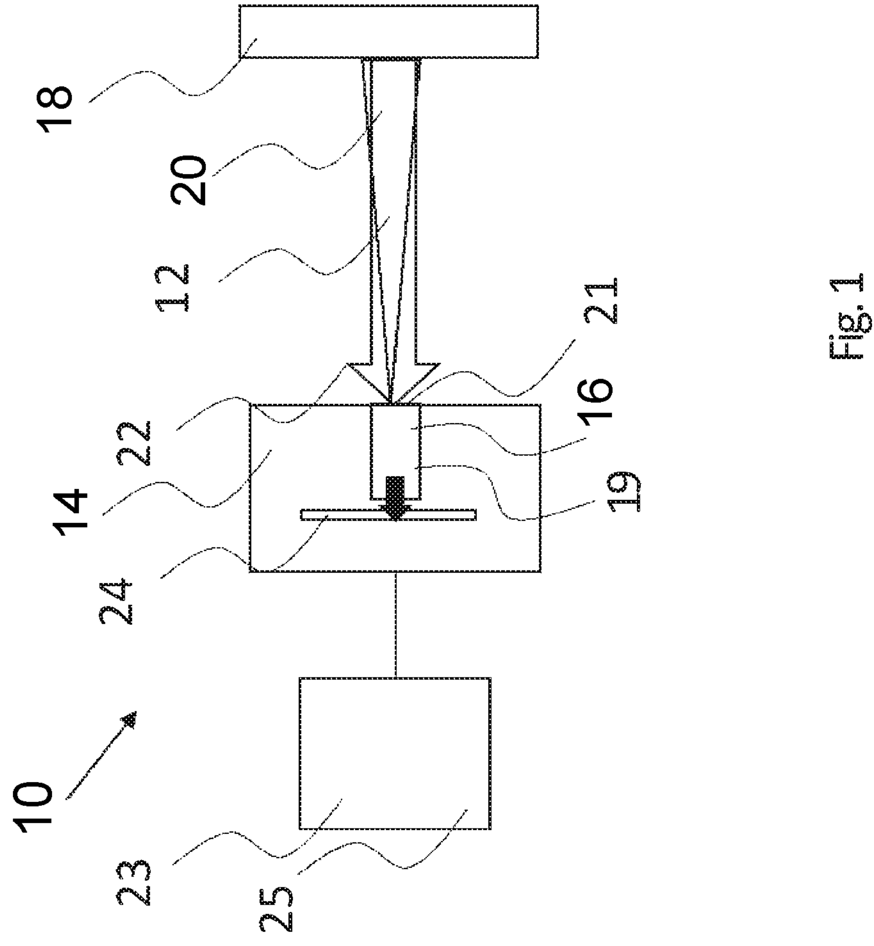
FIG. 1 shows a device for producing a light barrier, having a laser unit with at least one VCSEL and a reflector, according to some embodiments.

Embodiments of the present invention provide a device for producing a light barrier, which has a laser unit with at least one VCSEL, a photodiode associated with the VCSEL and a reflector, wherein the reflector reflects light emitted by the VCSEL, such that a light reflection produced as a result is received by the photodiode and produces a detection signal, from which a direct current signal component is subtracted so that an alternating current component of the detection signal is provided as an evaluation signal which has a higher signal-to-noise ratio than the detection signal, such that an evaluation device connected to the VCSEL is able to detect an interruption of the light reflection.

This produces a strong signal which is recognizable in the alternating current component.

In particular, self-mixing interference can also be present if a produced light reflection penetrates into the VCSEL and produces self-mixing interference that further amplifies the detection signal.

If an object interrupts the light barrier, no self-mixing interference can occur in the VCSEL, as the light reflection cannot penetrate the VCSEL. A transparent object can also be detected in this way if the self-mixing interference based on the light reflection changes when the light passes through the transparent object compared to an undisturbed self-mixing interference. For this purpose, the evaluation device can be designed in such a way that it recognizes such changes and interprets them as an interruption by a transparent object. The evaluation can be carried out using Fourier algorithms.

The VCSEL (vertical-cavity surface-emitting laser) is a surface emitter, which is a laser diode in which the light is emitted perpendicular to the plane of the semiconductor chip from an emission region, in contrast to the edge-emitting laser diode, in which the light is emitted from one or two edges of the chip. The VCSEL is made up of layers in a stack design. In this regard, it has a cavity produced by two Bragg mirrors, between which an active photon-emitting layer is arranged.

Advantageously, the VCSEL is associated with the photodiode, which is integrated into the design of the VCSEL. In this regard, the photodiode is integrated into the stack of layers on which the VCSEL is based. This allows for a compact design of the VCSEL and the photodiode, which can be produced in a joint manufacturing process.

Preferably, the photodiode can be integrated between a node and an extremum of a standing wave adjacent to the node within the VCSEL. A standing wave of laser light forms within the cavity of the VCSEL. This wave interferes with the reflected light in the case of self-mixing interference. The photodiode can be positioned at a first Bragg mirror that is further away from the emission region than the second Bragg mirror. Here, changes in the standing wave, which manifest themselves for example in a beating of the wave, can be detected.

In this regard and in a further development, multiple photodiodes can be integrated in the VCSEL, wherein the signals of the photodiodes are subtracted from one another. For example, one photodiode can also be positioned in the region of a node and the other in the region of an anti-node, i.e., an extremum.

In particular, the reflector can be a so-called retroreflector. The reflector can be equipped with back-reflecting prisms or spheres in a cat's eye-like manner. Mirrors or reflective flakes can also be part of the reflector.

A beam deflection element is preferably arranged between the reflector and the VCSEL. The beam deflection element can be a mirror or a prism that deflects the light emerging into the beam deflection element by an angle such as 90° relative to the incident light. This makes it possible to construct a light barrier with only one laser unit and one reflector, which has a geometry that differs from a simple straight line.

In order to realize the longest possible light barrier, an optical element can be arranged between the VCSEL and the reflector, which collimates or focuses the light.

In order to achieve a compact design, the VCSEL can be a bottom emitter, wherein an optical element is attached to the VCSEL such that the light passes through the optical element. With the bottom emitter, the emission region is on the rear side of the VCSEL so that the light passes through the substrate of the VCSEL and is emitted. The optical element can be bonded to the rear side of the VCSEL as a separate element or formed from the substrate of the bottom emitter.

The laser unit has a plurality of VCSELs which are arranged along a defined geometric shape. This allows the VCSELs to be arranged according to a geometric shape that supports a function for the device. For example, the geometric shape can be a circular shape, wherein the VCSELs are arranged at equal distances from one another along the circular shape.

Here, the reflector can perform a movement so that not all VCSELs exhibit self-mixing interference at the same time. Only the VCSELs that illuminate the reflector and whose light is reflected into the cavity of the VCSEL exhibit self-mixing interference. In this regard, the movement reflects the laser light of a part of the VCSEL, which illuminates the reflector along its trajectory.

The reflector has a reflector surface that is smaller than that of the geometric shape. The geometric shape has dimensions. At least one dimension of the geometric shape is smaller than the one dimension of the reflector surface such that along the dimension of the geometric shape the reflector surface does not completely cover the geometric shape. In other words, part of the VCSEL on the geometric shape emits past the reflector surface. The movement can constitute a rotation of the reflector.

In another exemplary embodiment, the reflector surface is shaped in the manner of a line, wherein the reflector surface extends radially from the center of the rotation. The reflector surface rotates in a synchronous rotation. Preferably, only the light from a single VCSEL is reflected by the reflector surface.

Preferably, the center of the rotation and the center of the circular shape of the geometric shape are positioned on a common axis which coincides with the axis of rotation.

Advantageously, the at least one VCSEL is connected to a driver means which produces a pulsed operation of the VCSEL.

It is to be understood that the features specified above and the features yet to be explained below may be used not only in the specified combination but also in other combinations. Thus, the light in any exemplary embodiment can be pulsed and/or frequency modulated. Each of the embodiments can have at least one optical element and/or a beam deflector.

Each embodiment of the present invention can be implemented with a so-called top emitter and/or bottom emitter.

Embodiments of the present invention are explained in more detail below with reference to the associated drawings. Direction indications in the following explanation are to be understood according to the reading direction of the drawings.

FIG. 1 shows a device 10 for producing a light barrier 12, which has a laser unit 14 with at least one VCSEL 16 and a reflector 18.

The VCSEL (vertical-cavity surface-emitting laser) 16 is a surface emitter, which is a laser diode that emits light 20 perpendicular to the plane of the semiconductor chip from an emission region 21. The VCSEL 16 is made up of layers with different functions in a stack design. In this regard, it has a cavity 19 produced by two Bragg mirrors, between which an active photon-emitting layer is arranged. The active layer is supplied with electrical energy via electrical contacts so that photons in the cavity 19 are bundled into coherent laser light and emerge from the emission region. In this regard, at least one standing wave is formed in the cavity 19.

The photodiode outputs a detection signal that has an alternating current and a direct current component.

The reflector 18 reflects the light 20 emitted by the VCSEL 16. A light reflection 22 produced as a result penetrates into the VCSEL 16 and produces self-mixing interference. The light reflection 22 is shown as a schematic arrow in FIG. 1. The reflector 18 is a so-called retroreflector, which is equipped with back-reflecting prisms or spheres in a cat's eye-like manner. Alternatively or additionally, the reflector 18 can also comprise a mirror or a coating with reflective flakes.

The VCSEL 16 is connected to an evaluation device 23, which is provided for evaluating the self-mixing interference. If an object is now moved into the light barrier 12, the light reflection 22 is interrupted, thus preventing a self-mixing interference. Such an object can be a person or an item. The evaluation device 23 can also comprise a driver means 25 which controls and supplies power to the laser unit 14. Pulsed operation of the VCSEL 16 is possible, which is controlled by the driver means 25.

If the evaluation device 23 determines that there is no self-mixing interference, this is interpreted by the evaluation device 23 as the presence of an object in the region of the light barrier 12. Further, a distance and a speed of an object at the light barrier 12 with respect to the VCSEL 16 can be measured by emitting a frequency modulated light 20.

The device 10 in FIG. 1 has no optical element between the reflector 18 and the VCSEL 16 so that the light 20 from the VCSEL 16 diverges after being emitted from the emission region 21 and forms a laser light cone that is reflected. Accordingly, only part of the laser light of the laser light cone penetrates into the VCSEL 16 again.

Furthermore, a photodiode 24 can be integrated in the VCSEL 16 so that a more efficient evaluation of the self-mixing interference can be achieved. The photodiode 24 is integrated in the stack of layers on which the VCSEL 16 is based. In particular, the photodiode 24 is arranged on a side of the cavity 19 that faces away with respect to the active layer of the emission region 21. The photodiode 24 is positioned at the first Bragg mirror that is further away from the emission region 21 than the second Bragg mirror.

A standing light wave is formed within the VCSEL 16, which has nodes and at least one anti-node. The photodiode 24 is preferably positioned between a node and an anti-node in the stack of the VCSEL 16 and thus detects a change in the field provided by the standing wave when a beating of the light wave occurs. The beating is caused by the light reflection penetrating into the VCSEL 16, which triggers the self-mixing interference.

Alternatively, multiple photodiodes 24 can be integrated in the VCSEL 16, wherein the signals of the photodiodes 24 are subtracted from one another. In this regard, the photodiodes 24 can be arranged at different locations along the standing waves. One photodiode can be arranged in the region of a node and another photodiode in the region of an anti-node.

Figure 2:
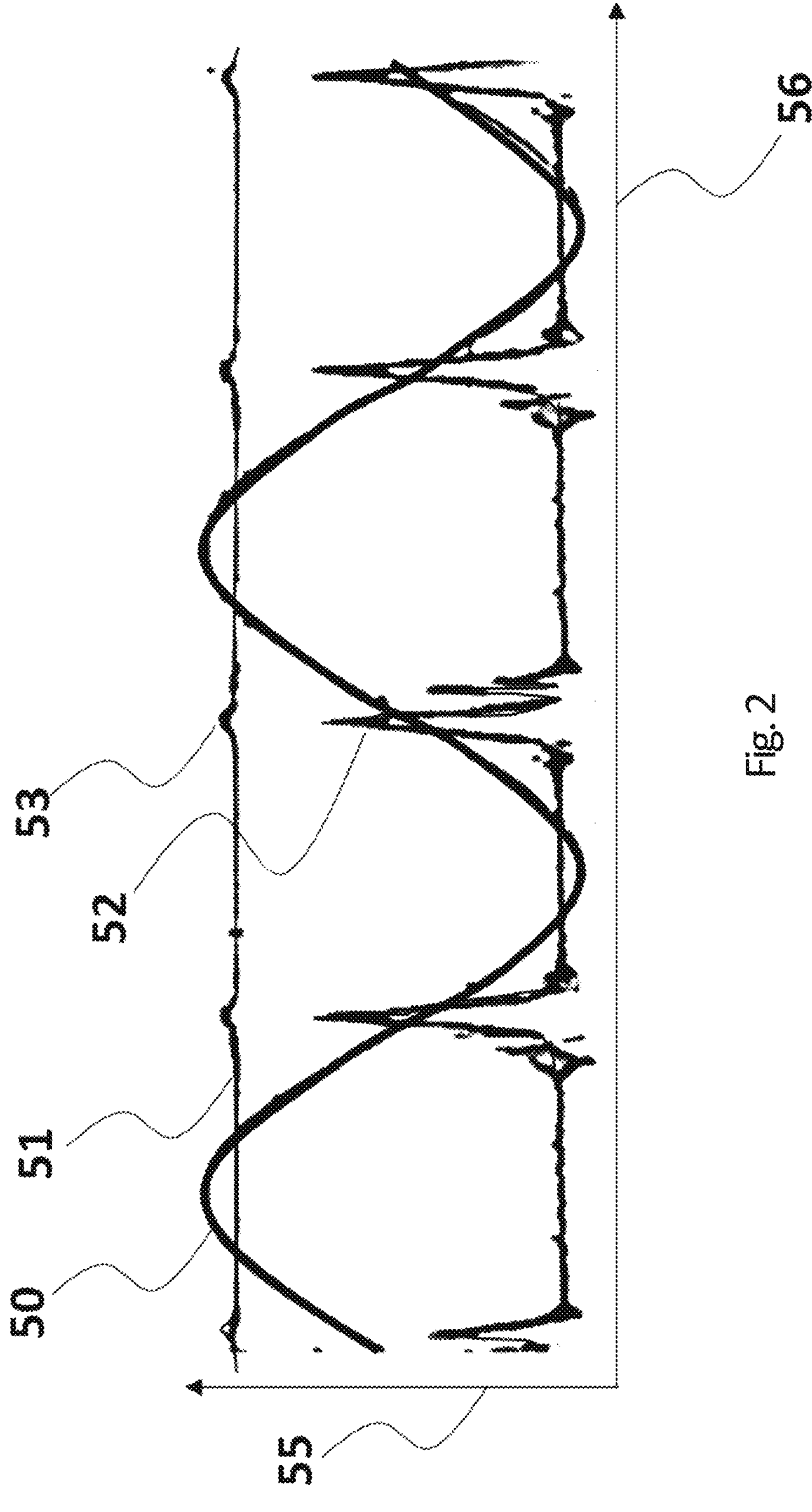
FIG. 2 shows a diagram of the alternating current signal and the direct current signal of a photodiode, according to some embodiments.

FIG. 2 shows a diagram of a detector signal of a photodiode 24, wherein the X-axis 56 indicates the course over time and the Y-axis 55 the signal strength. The detector signal contains an alternating current signal 50 and a direct current signal 51, wherein the alternating current signal 50 remains after subtracting the direct current signal 51. It has a higher signal-to-noise ratio than the direct current signal 51 so that detection of a weak light reflection is possible. This can be recognized by the ratio of the signal peaks 52, 53 of the two current signal curves 50, 51.

Figure 3:
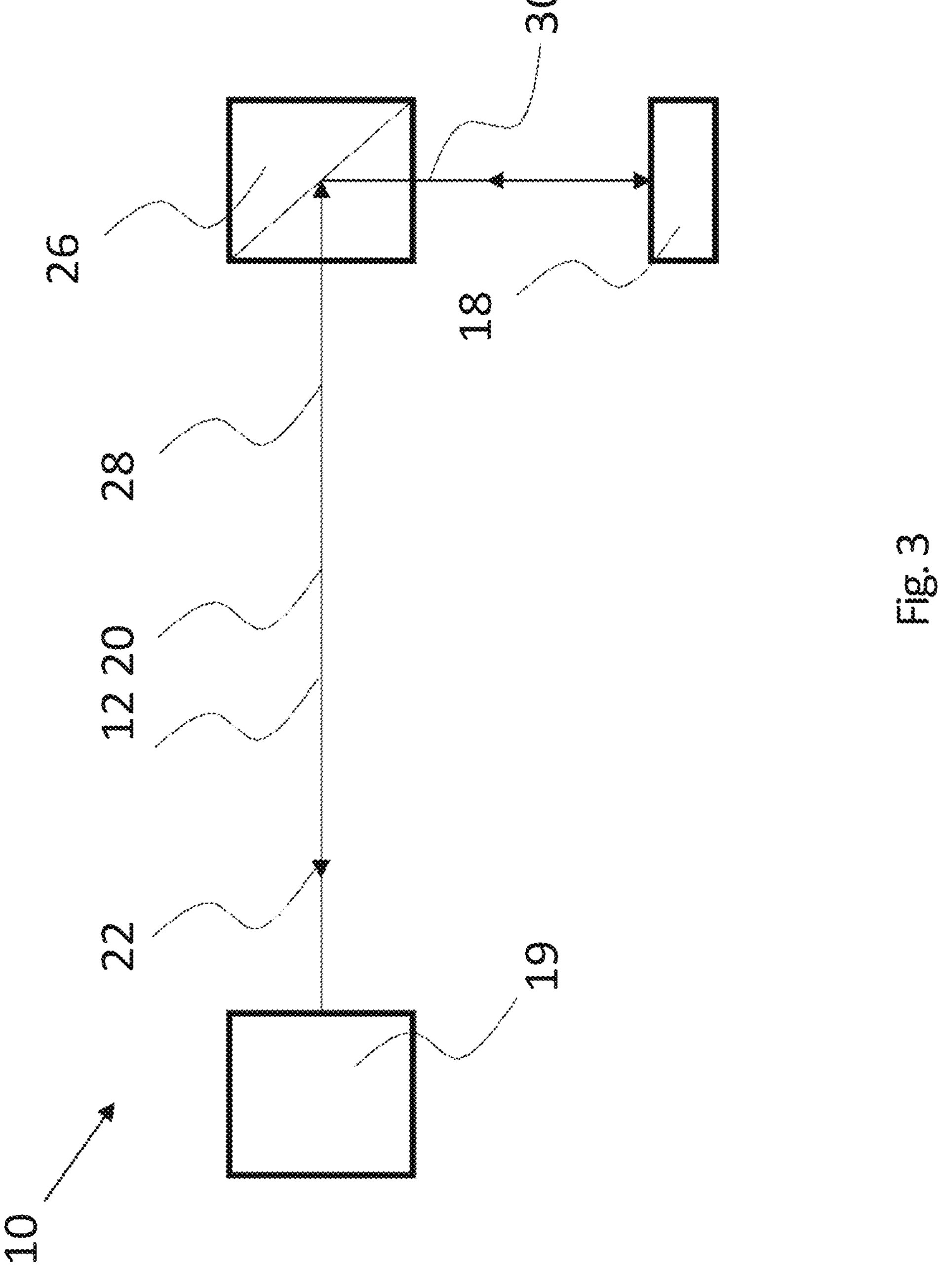
FIG. 3 shows a device with a beam deflection element between the VCSEL and the reflector, according to some embodiments.

The oscillation 54 reflects the periodic deflection of a beam deflection element 26 as shown in FIG. 3. This achieves a further signal improvement.

According to FIG. 3, a beam deflection element 26 can be arranged between the reflector 18 and the VCSEL 16. The beam deflection element 26 can be a mirror that is tilted relative to the beam axis of the VCSEL 16. Alternatively, a prism can also be used as a beam deflection element 26. The beam deflection element 26 deflects the light 20 emitted from the VCSEL 16. In the process, the light 28 entering the beam deflection element 26 is deflected by an angle such as 90° relative to the outgoing light 30. Multiple beam deflection elements 26 can also be used. The beam deflection element 26 can be combined with at least one optical element in order to shape the beam.

Figure 4:
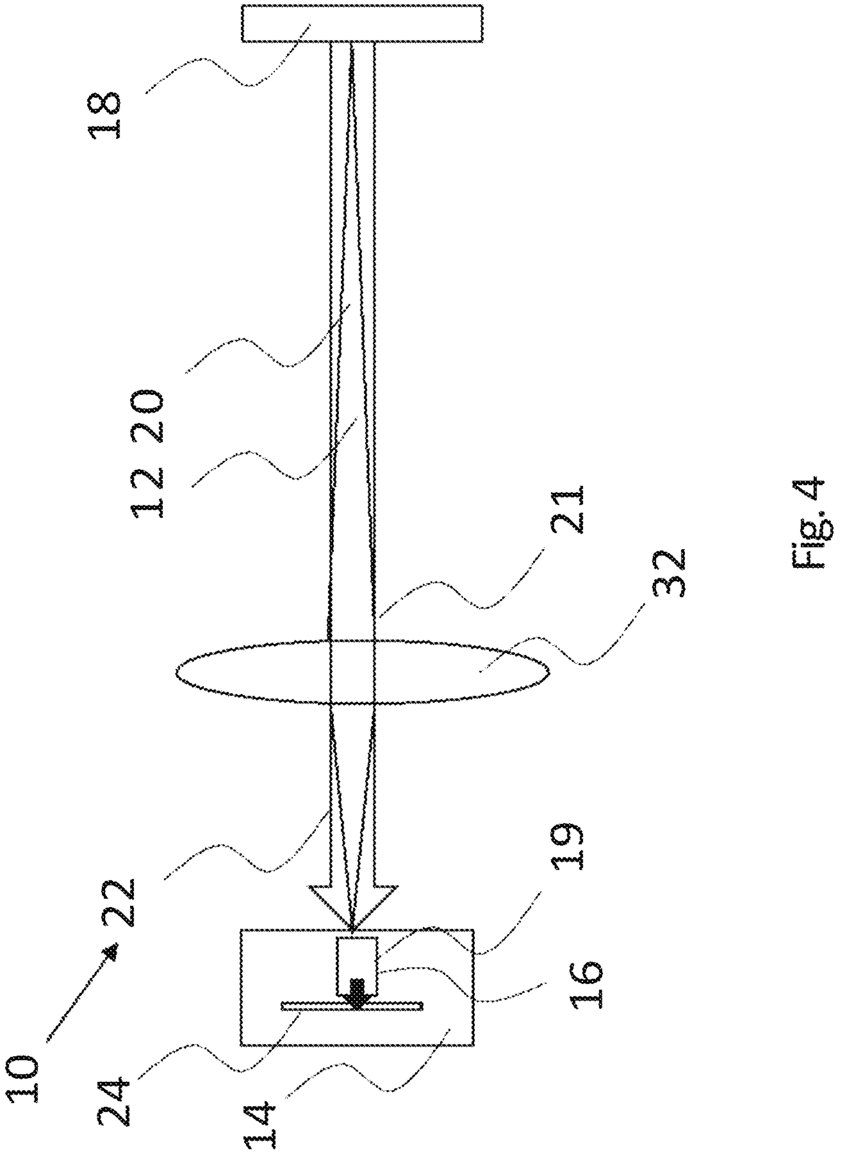
FIG. 4 shows a device for producing a light barrier, having a laser unit with at least one VCSEL and a reflector, wherein an optical element forms the light barrier, according to some embodiments.

FIG. 4 shows a device 10 that includes an optical element 32 that is provided for shaping the light 20. The light 20 is collimated or focused by the optical element 32. In this regard, the focus of the optical element 32 can be on the reflector 18. Alternatively, the light 20 can be focused only after the light 20 has been reflected by the reflector 18. By way of example only, the optical element 32 is designed as a separate component from the VCSEL, wherein the optical element 32 in FIG. 3 represents a lens.

Figure 5:
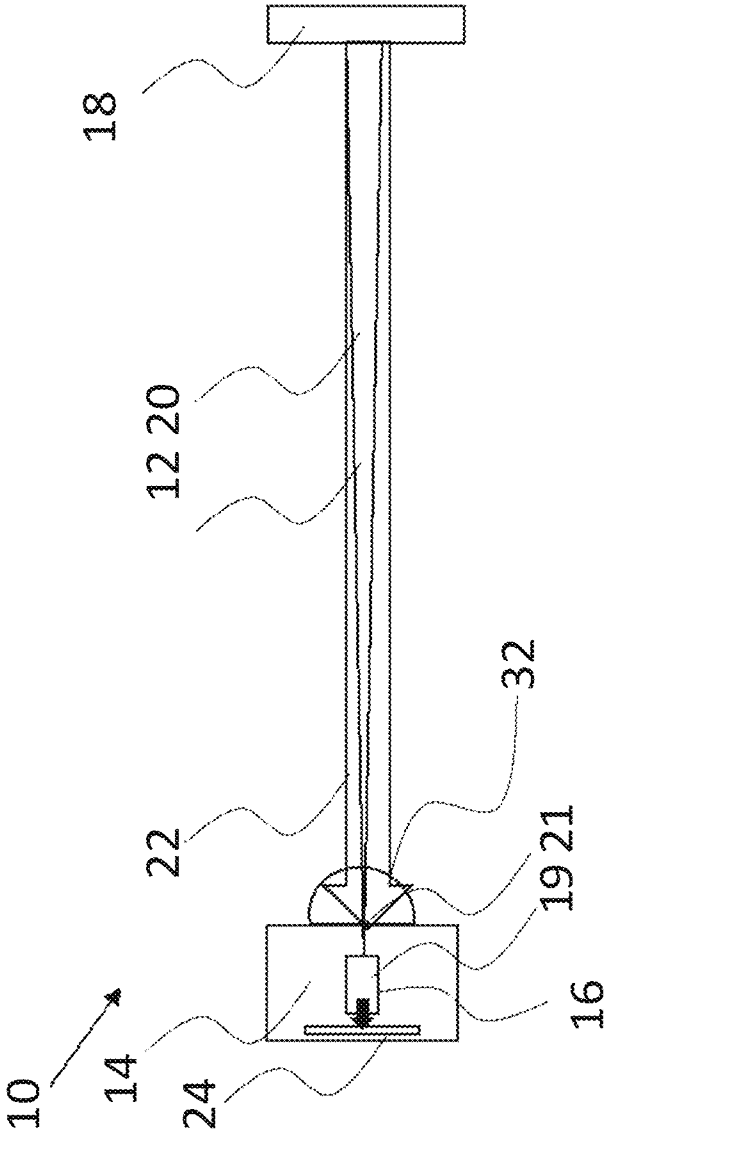
FIG. 5 shows a device for producing a light barrier, having a laser unit with at least one VCSEL and a reflector, wherein an optical element is arranged on the VCSEL, according to some embodiments.

According to FIG. 5, the VCSEL 16 can be implemented as a bottom emitter, wherein the optical element 32 is attached to the VCSEL 16. In this regard, the optical element is designed as a refractive lens, solely by way of example. Alternatively or additionally, a diffractive lens, a lens made of a photonic metamaterial and/or a holographic element can be used. In this regard, the optical element 32 can be formed from the substrate of the VCSEL 16 or can be attached to the substrate as an additional component. In this case, it can be bonded, for example.

The laser unit 14 can have a plurality of VCSELs 16. The VCSELs 16 are arranged in the laser unit 14. There, the VCSELs 16 are arranged along a geometric shape 34. The geometric shape 34 is shown as a dashed line in FIG. 5. The geometric shape 34 preferably corresponds to a defined and calculable shape such as a circle, a polygon or a line.

Figure 6:
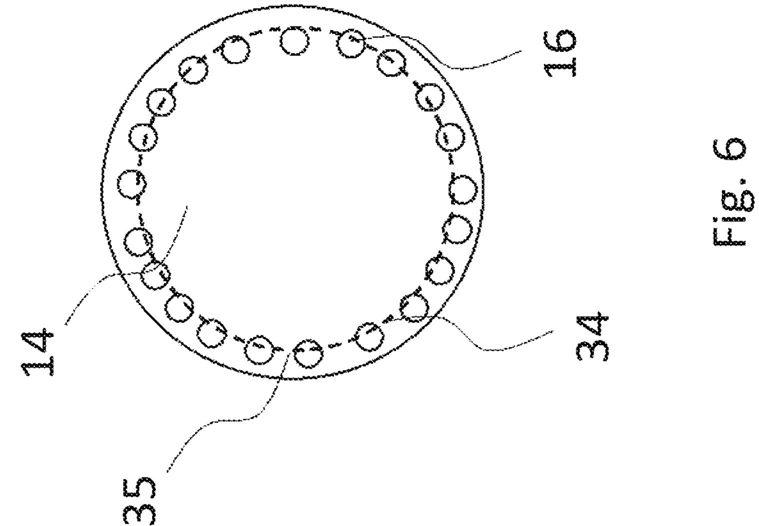
FIG. 6 shows a laser unit having a plurality of VCSELs in a circular arrangement according to some embodiments.

According to FIG. 6, the VCSELs 16 are arranged along a circular shape 35, which represents the geometric shape 34. The VCSELs 16 are arranged at equal distances from one another along the circular shape 35. Here, no further VCSELs 16 are arranged within the circle.

By using multiple VCSELs 16, for example, light barrier curtains can be produced that delimit a room volume. This can be used in safety-relevant rooms so that the passage of a person or object through the light barrier curtain is detected. The speed and shape of the person or object can also be detected if frequency modulated light is used.

Figure 7:
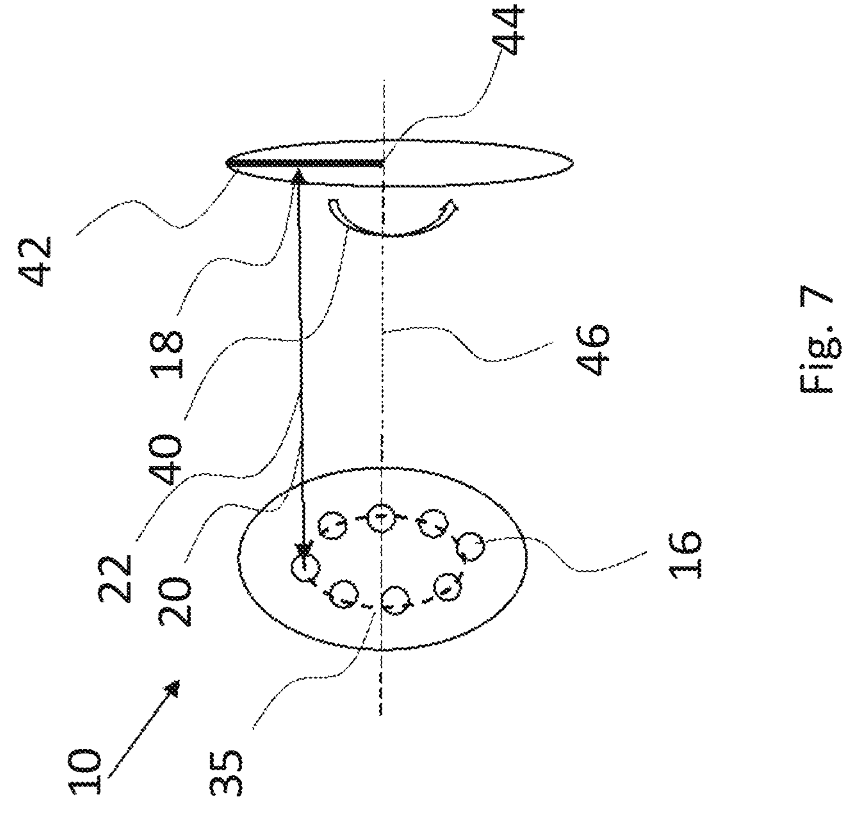
FIG. 7 shows a device with a rotating reflector according to some embodiments.

FIG. 7 shows an exemplary device 10 in which the reflector 18 is a rotating disc, while the laser unit 14 is at rest with respect to the reflector 18. Here, the reflector 18 performs a movement 40. The rotational movement has an axis of rotation that passes through the center of the circular shape 35 so that the circular shape 34 and the axis of rotation lie on a common axis 46.

A strip-shaped reflector surface 42 is arranged on the reflector 18. The reflector surface 42 extends radially outwards from the center 44 of the rotation. In this regard, the reflector surface 42 rotates in a synchronous rotation similar to a clock hand.

Since the reflector surface 42 is smaller than the geometric shape 34, only the light 20 from a part of the VCSEL 16 is reflected. For example, the light reflection 22 of a VCSEL 16 can be reflected back and produce self-mixing interference. For this purpose, the length of the reflector surface 42 shaped in the manner of a line can be at most as large as the diameter of the circular shape 35 and the width of the reflector surface 42 can be selected to be so large that light 20 from a single VCSEL 16 is reflected. The evaluation device can determine in which VCSEL 16 self-mixing interference is present and thus determine the position of the reflector surface. In this way, rotational speed sensors can be provided that function in a contactless manner over longer distances.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A device for producing a light barrier, the device comprising:

a laser unit with at least one vertical cavity surface emitting laser (VCSEL), a photodiode, and a reflector, wherein the reflector is configured to reflect light emitted by the VCSEL, such that a light reflection produced as a result is received by the photodiode, producing a detection signal, from which a direct current signal component is subtracted so that an alternating current component is provided as an evaluation signal, wherein the evaluation signal has a higher signal-to-noise ratio than the detection signal, such that an evaluation device connected to the VCSEL is able to detect an interruption of the light reflection if no self-mixing interference is present.

2. The device according to claim 1, wherein the light penetrates into the VCSEL and produces the self-mixing interference.

3. The device according to claim 2, wherein the photodiode is integrated within the VCSEL between a node and an extremum of a standing wave adjacent to the node.

4. The device according to claim 2, wherein multiple photodiodes are integrated in the VCSEL, wherein signals of the multiple photodiodes are subtracted from one another.

5. The device according to claim 1, wherein the reflector is a retroreflector.

6. The device according to claim 1, further comprising a beam deflection element arranged between the reflector and the VCSEL.

7. The device according to claim 1, further comprising an optical element arranged between the VCSEL and the reflector, wherein the optical element is configured to collimate or focus the light.

8. The device according to claim 7, wherein the VCSEL is a bottom emitter, wherein the optical element is attached to the VCSEL such that the light passes through the optical element.

9. The device according to claim 1, wherein the laser unit comprises a plurality of VCSELs arranged along a defined geometric shape.

10. The device according to claim 9, wherein the geometric shape is a circular shape, wherein the plurality of VCSELs is arranged at an equal distance from one another along the circular shape.

11. The device according to claim 9, wherein the reflector is configured to perform a movement.

12. The device according to claim 11, wherein the reflector has a reflector surface that is smaller than the geometric shape, wherein the movement comprises a rotation.

13. The device according to claim 12, wherein the reflector surface is shaped as a line, wherein the reflector surface extends radially from a center of the rotation.

14. The device according to claim 13, wherein the center of the rotation and a center of the circular shape of the geometric shape are positioned on a common axis.

15. The device according to claim 1, wherein the at least one VCSEL is connected to a driver configured to produce a pulsed operation of the VCSEL.

* * * * *